(12) United States Patent
Chellamuthu et al.

(10) Patent No.: US 10,382,030 B2
(45) Date of Patent: Aug. 13, 2019

(54) APPARATUS HAVING PROCESS, VOLTAGE AND TEMPERATURE-INDEPENDENT LINE TRANSIENT MANAGEMENT

(71) Applicant: Texas Instruments Incorporated, Dallas, TX (US)

(72) Inventors: Shanmuganand Chellamuthu, Richardson, TX (US); Kemal Safak Demirci, Dallas, TX (US); Anand Gopalan, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/647,825

(22) Filed: Jul. 12, 2017

(65) Prior Publication Data

US 2019/0020338 A1 Jan. 17, 2019

(51) Int. Cl.
  *G05F 1/575* (2006.01)
  *H03K 17/14* (2006.01)
  *G05F 1/56* (2006.01)

(52) U.S. Cl.
  CPC ............ *H03K 17/145* (2013.01); *G05F 1/56* (2013.01)

(58) Field of Classification Search
  USPC .................................................. 327/108–112
  See application file for complete search history.

(56) References Cited

U.S. PATENT DOCUMENTS

| | | | | |
|---|---|---|---|---|
| 5,818,289 A * | 10/1998 | Chevallier | ............ | H02M 3/073 327/536 |
| 6,812,778 B1 * | 11/2004 | Yeo | ......................... | G05F 3/267 327/382 |
| 6,933,772 B1 * | 8/2005 | Banerjee | .................. | G05F 1/565 323/277 |
| 7,417,473 B2 * | 8/2008 | Kawamoto | .............. | H03K 4/00 327/108 |
| 7,688,113 B2 * | 3/2010 | Nascimento | ........ | G06F 13/4072 326/82 |
| 8,575,968 B2 * | 11/2013 | Cyrusian | ............... | H03F 3/2173 327/108 |
| 8,754,698 B2 * | 6/2014 | Bittner | ............. | H03K 19/01825 327/109 |
| 9,389,620 B2 * | 7/2016 | Banag | ..................... | G05F 1/575 |
| 9,684,325 B1 * | 6/2017 | Rasmus | .................. | G05F 1/575 |
| 10,025,334 B1 * | 7/2018 | Derman | .................. | G05F 1/575 |
| 2003/0042940 A1 * | 3/2003 | Yoshikawa | ....... | H03K 19/00323 327/108 |
| 2003/0218450 A1 * | 11/2003 | Bonte | ..................... | G05F 1/575 323/273 |
| 2004/0217782 A1 * | 11/2004 | Brown | ............. | H03K 19/00346 327/108 |

(Continued)

*Primary Examiner* — Adam D Houston
(74) *Attorney, Agent, or Firm* — Lawrence J. Bassuk; Charles A. Brill; Frank D. Cimino

(57) ABSTRACT

A voltage regulator and a gate control circuit for an aid transistor coupled to assist a pass element for the voltage regulator during line transients having a given slope are disclosed. The gate control circuit includes a first circuit coupled to receive an output voltage of the voltage regulator on a first node and to provide a gate control voltage that mirrors the output voltage on a second node. A low pass filter is coupled to receive the gate control voltage and to provide a filtered gate control voltage to the gate of the aid transistor.

20 Claims, 10 Drawing Sheets

(56) References Cited

U.S. PATENT DOCUMENTS

| | | | |
|---|---|---|---|
| 2005/0017767 A1* | 1/2005 | Huang | H02M 3/1588 327/110 |
| 2006/0044068 A1* | 3/2006 | Alenin | H03F 3/3069 330/301 |
| 2006/0192538 A1* | 8/2006 | Wang | G05F 1/575 323/282 |
| 2008/0231364 A1* | 9/2008 | Yu | H03F 3/45183 330/255 |
| 2009/0078045 A1* | 3/2009 | Kanai | G01C 19/56 73/584 |
| 2009/0212829 A1* | 8/2009 | Kan | H04L 25/028 327/108 |
| 2011/0267017 A1* | 11/2011 | Zhang | G05F 1/575 323/280 |
| 2011/0309808 A1* | 12/2011 | Zanchi | G05F 3/262 323/282 |
| 2012/0326754 A1* | 12/2012 | Hadji-Abdolhamid | H03K 19/00 327/108 |
| 2013/0009670 A1* | 1/2013 | Chang | H03K 3/0322 327/108 |
| 2014/0176098 A1* | 6/2014 | Fang | G05F 1/46 323/280 |
| 2014/0247028 A1* | 9/2014 | Pons | G05F 1/575 323/281 |
| 2014/0340067 A1* | 11/2014 | Zhong | G05F 3/08 323/311 |
| 2014/0368176 A1* | 12/2014 | Mandal | G05F 1/445 323/280 |
| 2015/0002130 A1* | 1/2015 | Kumar | G05F 3/30 323/313 |
| 2015/0008871 A1* | 1/2015 | Petenyi | G05F 1/625 320/107 |
| 2015/0123635 A1* | 5/2015 | Huang | G05F 1/575 323/281 |
| 2015/0200634 A1* | 7/2015 | Maige | H03F 3/45179 330/261 |
| 2015/0220096 A1* | 8/2015 | Luff | G02F 1/1368 327/109 |
| 2016/0105175 A1* | 4/2016 | Ishimatsu | H03K 19/0016 327/109 |
| 2016/0173066 A1* | 6/2016 | Yang | H03K 19/0013 327/109 |
| 2016/0216723 A1* | 7/2016 | Fu | G05F 3/08 |
| 2016/0334819 A1* | 11/2016 | Pelicia | G05F 1/575 |
| 2016/0380534 A1* | 12/2016 | Harshey | H02M 3/157 323/271 |
| 2017/0070192 A1* | 3/2017 | Martchovsky | H03B 1/04 |
| 2017/0115680 A1* | 4/2017 | Zhou | G05F 1/56 |
| 2017/0364110 A1* | 12/2017 | Golara | G05F 1/573 |
| 2017/0371365 A1* | 12/2017 | Kossel | G05F 1/575 |
| 2018/0172750 A1* | 6/2018 | Rajagopal | G01R 19/2513 |
| 2018/0173261 A1* | 6/2018 | Dahl | G05F 1/575 |
| 2018/0188753 A1* | 7/2018 | Derman | G05F 1/575 |

* cited by examiner

APPARATUS HAVING PROCESS, VOLTAGE AND TEMPERATURE-INDEPENDENT LINE TRANSIENT MANAGEMENT

FIELD OF THE DISCLOSURE

Disclosed embodiments relate generally to the field of line transient management. More particularly, and not by way of any limitation, the present disclosure is directed to an apparatus having process, voltage and temperature-independent line transient management.

BACKGROUND

Voltage regulators and other circuits that supply power to integrated circuit chips are relied on to deliver a consistent voltage, even when the power received by the voltage regulator varies widely. Sudden transients, such as a drop or spike in an input voltage, can cause output voltage transients that can result in reset of the circuitry supplied by the voltage regulator. Improvements to existing circuits are needed.

SUMMARY

Disclosed embodiments provide a control circuit for an aid transistor in a low-dropout (LDO) voltage regulator or other circuit. The control circuit is process, voltage and temperature-independent and does not interfere with the main voltage regulation loop. The output voltage is converted to a second voltage that does not change as quickly as the output voltage. This second voltage is used to drive the gate of an aid transistor whose source is coupled to the output voltage. When the output voltage changes suddenly, the lag in the second voltage causes the aid transistor to turn ON and assist the pass element. As the second voltage "catches up" to the output voltage, aid transistor is turned OFF. Slower changes in the output voltage do not cause the aid transistor to turn ON.

In one aspect, an embodiment of a control circuit for an aid transistor coupled to assist a pass element for a voltage regulator during line transients having a given slope is disclosed. The control circuit includes a first circuit coupled to receive an output voltage of the voltage regulator on a first node and to provide a gate control voltage that mirrors the output voltage on a second node; and a low pass filter coupled to receive the gate control voltage and to provide a filtered gate control voltage to the gate of the aid transistor.

In another aspect, an embodiment of a low-dropout regulator is disclosed. The low-dropout regulator includes a pass element coupled between an upper rail and a lower rail and further coupled to provide an output voltage on an output node; a first aid transistor coupled to pull the output voltage in a first direction; and a first gate control circuit coupled to sense the output voltage and to convert the sensed output voltage to a gate control voltage that is provided to the gate of the first aid transistor, wherein the control gate voltage turns ON the first aid transistor only during a transient having a first slope, the first gate control circuit being substantially independent of process, temperature and voltage changes.

In yet another aspect, an embodiment of a low-dropout (LDO) regulator is disclosed. The LDO includes a first P-type metal oxide silicon (PMOS) transistor coupled as a pass element in series with a voltage divider between an upper rail and a lower rail and further coupled to provide an output voltage on an output node; an error amplifier coupled to receive a reference voltage on a first terminal and a feedback voltage on a second terminal and to control the gate of the PMOS pass element, the feedback voltage being taken from a point internal to the voltage divider; a first N-type metal oxide silicon (NMOS) transistor coupled as an NMOS aid transistor to pull the output voltage toward the upper rail when turned ON; a second PMOS transistor coupled as a PMOS aid transistor to pull the output voltage toward the lower rail when turned ON; a first gate control circuit coupled to receive the output voltage and to convert the received output voltage to a first filtered gate control voltage that is provided to the gate of the NMOS aid transistor, wherein the first filtered gate control voltage turns ON the NMOS aid transistor only during a transient having a negative slope; a second gate control circuit coupled to receive the output voltage and to convert the received output voltage to a second filtered gate control voltage that is provided to the gate of the PMOS aid transistor, wherein the second filtered gate control voltage turns ON the PMOS aid transistor only during a transient having a positive slope, the first gate control circuit and the second gate control circuit being substantially independent of process, temperature and voltage changes.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

A low-dropout or LDO regulator is a DC linear voltage regulator that can regulate an output voltage even when the supply voltage is very close to the output voltage. The advantages of a low dropout voltage regulator include the absence of switching noise, as no switching takes place, smaller device size, and greater design simplicity. In one automotive application, LDOs are required that can provide low-dropout voltage as high as 5 volts while supporting a stable load current at low voltage levels from a battery. The power from the battery can drop below 6 volts, e.g., during cold crank conditions.

The pass element or output transistor of the LDO can be implemented using an N-type metal oxide semiconductor (NMOS) transistor, a P-type metal oxide semiconductor (PMOS) transistor, junction field effect transistor, etc. For high voltage applications, NMOS transistors are often preferred for the pass element, while for low voltage applications, PMOS transistor are more commonly preferred. The NMOS transistor requires a gate voltage higher than its source voltage, i.e., the output of the LDO. Therefore a charge pump may be necessary to increase the voltage level of the gate in an embodiment that utilizes an NMOS transistor. The charge pump requires additional die area and adds to circuit complexity. In contrast, the PMOS transistor has a better dropout performance since its gate voltage is always lower than its source voltage. Thus, the appropriate choice for low voltage applications without the use of charge pumps is the use of a PMOS LDO. However, the line transient response of a PMOS LDO is inferior compared to that of an NMOS LDO. Line transient performance is especially important in automotive applications where the battery voltage can fluctuate considerably in a very short time, e.g., 10 V/µs. Therefore, there is a need in automotive applications for an LDO that can support both low battery operation and provide the necessary line transient immunity.

Figure 10:
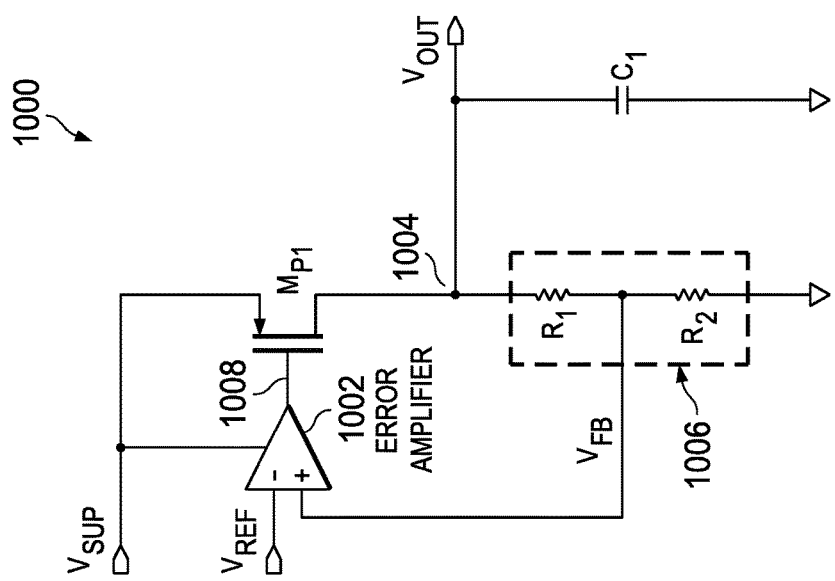
FIG. 10 depicts an LDO according to the prior art.

FIG. 10 is a schematic diagram of an LDO voltage regulator 1000 according to the prior art. LDO voltage regulator 1000 includes a PMOS pass element, which in the disclosed embodiments is transistor $M_{P1}$ and an error amplifier 1002. Pass transistor $M_{P1}$ has a source coupled to supply voltage $V_{SUP}$, a gate controlled by the output of error amplifier 1002, and a drain coupled through node 1004 to the output node, which provides the output voltage $V_{OUT}$. Resistors $R_1$ and $R_2$ are coupled in series between node 1004 and the lower rail and form a voltage divider 1006. A feedback voltage $V_{FB}$ is taken from a point between resistor $R_1$ and resistor $R_2$ and is provided to the non-inverting input of error amplifier 1002. Reference voltage $V_{REF}$ is provided to the inverting input of error amplifier 1002. If the feedback voltage becomes greater than the reference voltage, control signal 1008 changes the on-state of pass transistor $M_{P1}$ to effectively increase the resistance of the voltage regulator circuit and maintain a constant output voltage $V_{OUT}$. Capacitor $C_1$ is coupled between $V_{OUT}$ and the lower rail and serves to stabilize the output voltage $V_{OUT}$. LDO voltage regulator 1000 does not include any form of line transient protection. Because of the lack of line transient protection, circuitry supplied by a voltage regulator utilizing this configuration can experience a reset when the supply voltage drops suddenly, because the feedback loop is not able to respond quickly enough to prevent a large drop in the output voltage.

Figure 11:
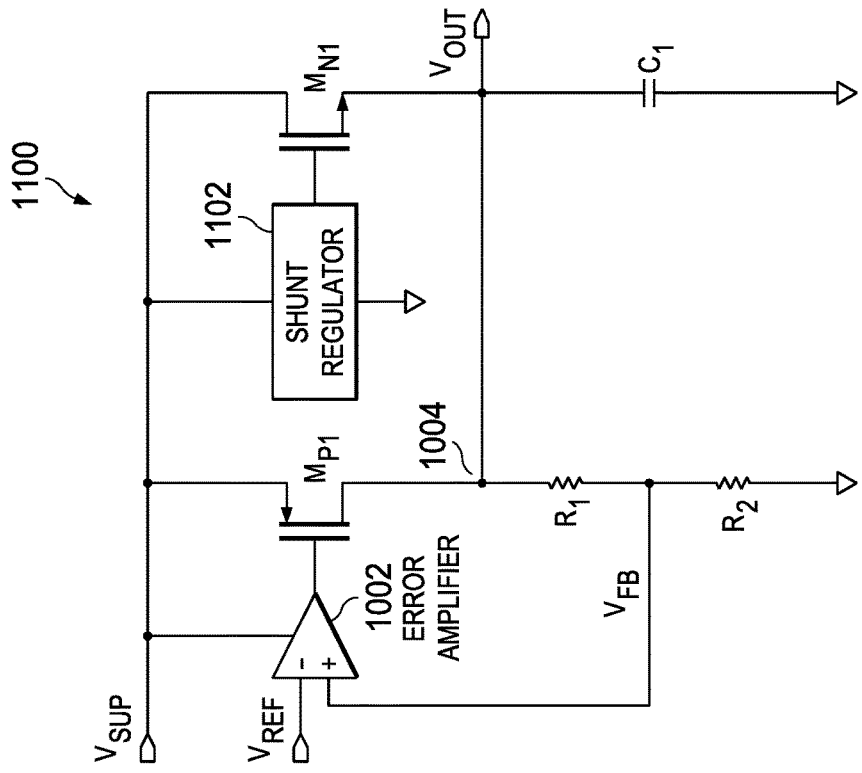
FIG. 11 depicts an LDO according to the prior art.

FIG. 11 depicts a schematic diagram of an LDO 1100 according to the prior art. LDO 1100 contains all of the elements of LDO 1000 and also contains an NMOS aid transistor $M_{N1}$. NMOS aid transistor $M_{N1}$ is coupled between the upper rail and the output voltage and the gate of $M_{N1}$ is controlled by a regulated voltage that is generated using, e.g., a shunt regulator 1102. Shunt regulator 1102 receives a supply voltage from $V_{SUP}$; when $V_{SUP}$ drops, node 1004 drops, inherently turning ON aid transistor $M_{N1}$, which then acts to pull up output voltage $V_{OUT}$.

One problem with this circuit, however, is that because of process and temperature variations, the gate voltage applied to the aid transistor has no relationship to the output voltage of the LDO or the threshold voltage of the aid transistor. Therefore, it is possible for the shunt regulator 1102 to turn ON aid transistor $M_{N1}$ unnecessarily, i.e., during normal operations, which interferes with the operation of the pass transistor. When this occurs, aid transistor $M_{N1}$ can pull up output voltage $V_{OUT}$ to a point that causes pass transistor $M_{P1}$ to shut down; at such times, no real voltage regulation can be provided. If a transient event has passed and the aid transistor continues to support the load current, the accuracy of the regulated output voltage is affected. Another problem encountered is gain reduction in the main loop, which affects stability because the majority of the load current is being supported by the NMOS aid transistor and not by the main PMOS transistor. Another issue arises when different output voltages are desired from the LDO. In this event, the reference gate voltage for the aid transistor must be re-adjusted. When both NMOS and PMOS aid transistors are used, both of their reference gate voltages have to be individually trimmed so that the possibility of cross conduction current between the aid transistors is avoided.

Figure 1:
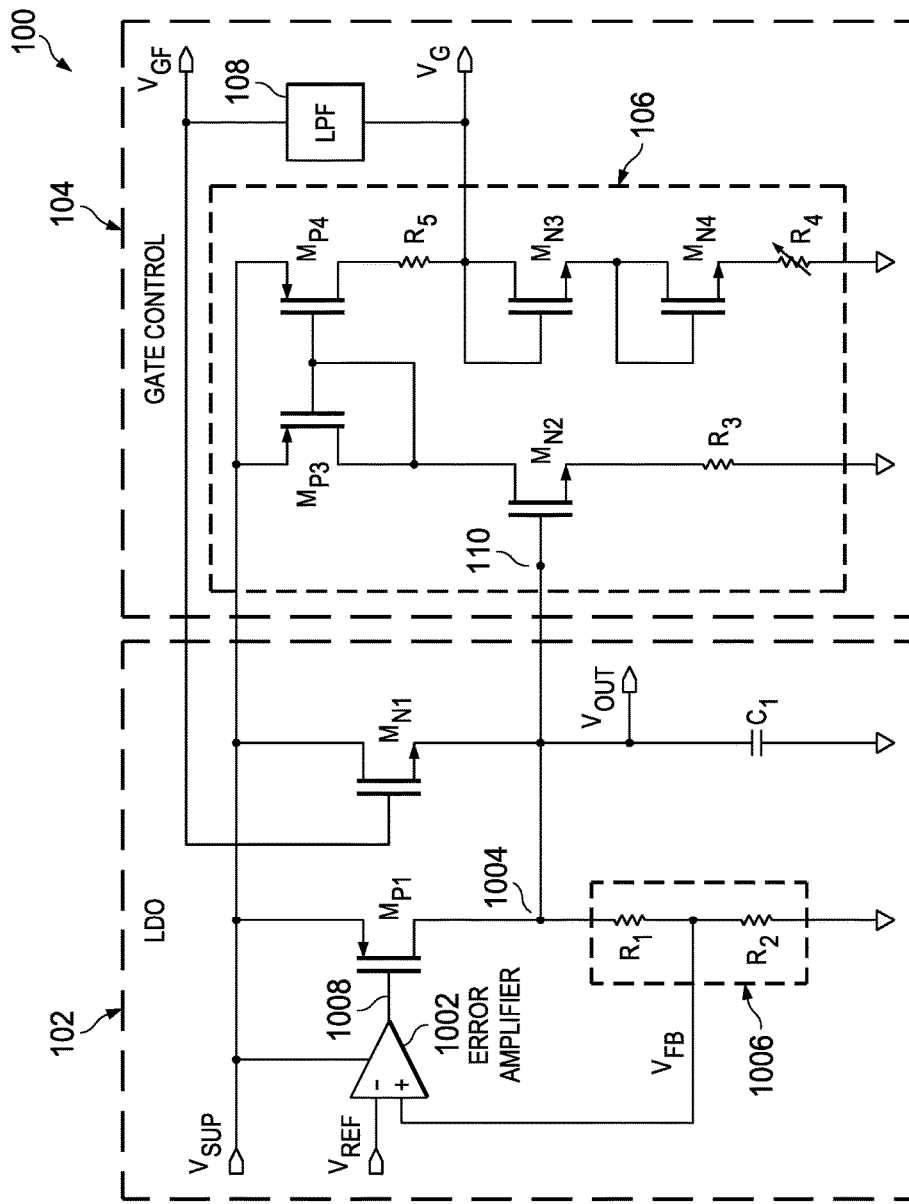
FIG. 1 depicts an example of an LDO according to an embodiment of the disclosure.

Referring now to FIG. 1, a schematic diagram of an LDO circuit 100 is shown according to an embodiment of the disclosure. LDO circuit 100 includes LDO 102 and gate control circuit 104. LDO 102 contains all of the elements of prior art LDO voltage regulator 1000 and also includes NMOS aid transistor $M_{N1}$ to pull up output voltage $V_{OUT}$ during transient drops. The gate of NMOS aid transistor $M_{N1}$ is controlled by gate control circuit 104.

Gate control circuit 104 includes a current mirror circuitry 106 and a low pass filter 108. One leg of the current mirror is formed by PMOS transistor $M_{P3}$, NMOS transistor $M_{N2}$ and resistor $R_3$, which are coupled in series between supply voltage $V_{SUP}$, which forms the upper rail, and the lower rail. A second leg of the current mirror is formed by PMOS transistor $M_{P4}$, resistor $R_5$, NMOS transistors $M_{N3}$ and $M_{N4}$, and variable resistor $R_4$, which are also coupled in series between the upper rail and the lower rail. PMOS transistor $M_{P3}$ is diode-coupled and the gates of PMOS transistors $M_{P3}$ and $M_{P4}$ are coupled together; both of NMOS transistors $M_{N3}$ and $M_{N4}$ are diode coupled.

Gate control circuit 104 receives the output voltage $V_{OUT}$ at node 110, which in the embodiment shown is the gate of NMOS transistor $M_{N2}$, and converts $V_{OUT}$ into a current using resistor $R_3$. The current through transistor $M_{N2}$ is mirrored using the current mirror 106 and used to provide a gate control voltage $V_G$. Gate control voltage $V_G$ is filtered using a low-pass filter (LPF) 108 to generate filtered gate control voltage $V_{GF}$, which controls the action of NMOS aid transistor $M_{N1}$. The value of gate control voltage $V_G$ and therefore of filtered gate control voltage $V_{GF}$ is set by the two diode-connected NMOS transistors, $M_{N3}$, $M_{N4}$, and resistor $R_4$. The ratio between resistors $R_4$ and $R_3$ is selected so that during normal operation, gate control voltage $V_G$ is set slightly below the threshold voltage of NMOS aid transistor $M_{N1}$, thereby placing aid transistor $M_{N1}$ at the verge of conduction. Resistor $R_4$ is designed as a variable resistor and the value of resistor $R_4$ can be set by the customer to adjust the sensitivity of aid transistor $M_{N1}$ to transients to fit current requirements.

During a line transient having a negative slope, supply voltage $V_{SUP}$ decreases rapidly. The voltage regulation loop formed by voltage divider 1006 and error amplifier 1002 is slow to respond, i.e., the loop has a finite bandwidth, so a temporary voltage dip in output voltage $V_{OUT}$ occurs. This voltage dip in turn causes the current through both legs of current mirror 106 to decrease and also decreases gate control voltage $V_G$. However, the low pass filter 108 filters out this sudden drop in the gate control voltage $V_G$ so that filtered gate control voltage $V_{GF}$ stays relatively stable and drops over a longer time period. This stability of filtered gate control voltage $V_{GF}$ increases the gate-to-source voltage of NMOS aid transistor $M_{N1}$ above the threshold voltage of transistor $M_{N1}$ as output voltage $V_{OUT}$ decreases and turns ON aid transistor $M_{N1}$. Aid transistor $M_{N1}$ is able to pull up output voltage $V_{OUT}$ and reduce the voltage dip in $V_{OUT}$. As the value of filtered gate control voltage $V_{GF}$ slowly drops to the value of gate control voltage $V_G$, aid transistor $M_{N1}$ will be turned OFF. During the time that aid transistor $M_{N1}$ is turned on, pass transistor $M_{P1}$ recovers the ability to provide the required output voltage due to the action of the associated voltage regulation loop. It is noteworthy at this point that if the output voltage $V_{OUT}$ drops over a longer period of time such that the voltage regulation loop is able to adjust, the aid transistor will not be turned ON.

In order to make gate control circuit 104 process and temperature independent, NMOS transistors $M_{N3}$, $M_{N4}$ are each matched to one of NMOS aid transistor $M_{N1}$ and NMOS transistor $M_{N2}$; PMOS transistors $M_{P3}$, $M_{P4}$ are matched to each other; and the resistors $R_3$ and $R_4$ are matched. The use of matching transistors and the fact that control of the NMOS aid transistor is responsive to the output voltage $V_{OUT}$ provides another advantage. In the prior art, the values of the reference voltage $V_{REF}$ and of resistors $R_1$, $R_2$ can be exposed to the customer, allowing the output voltage $V_{OUT}$ to be adjusted. However, when an aid transistor is utilized, as in prior art LDO 1100, there was no possibility of adjusting the values necessary to ensure proper operation of the aid transistor. In contrast, the disclosed embodiments can detect when the output voltage $V_{OUT}$ is modified and will automatically adjust to ensure proper operation of the aid transistors.

Figure 2:
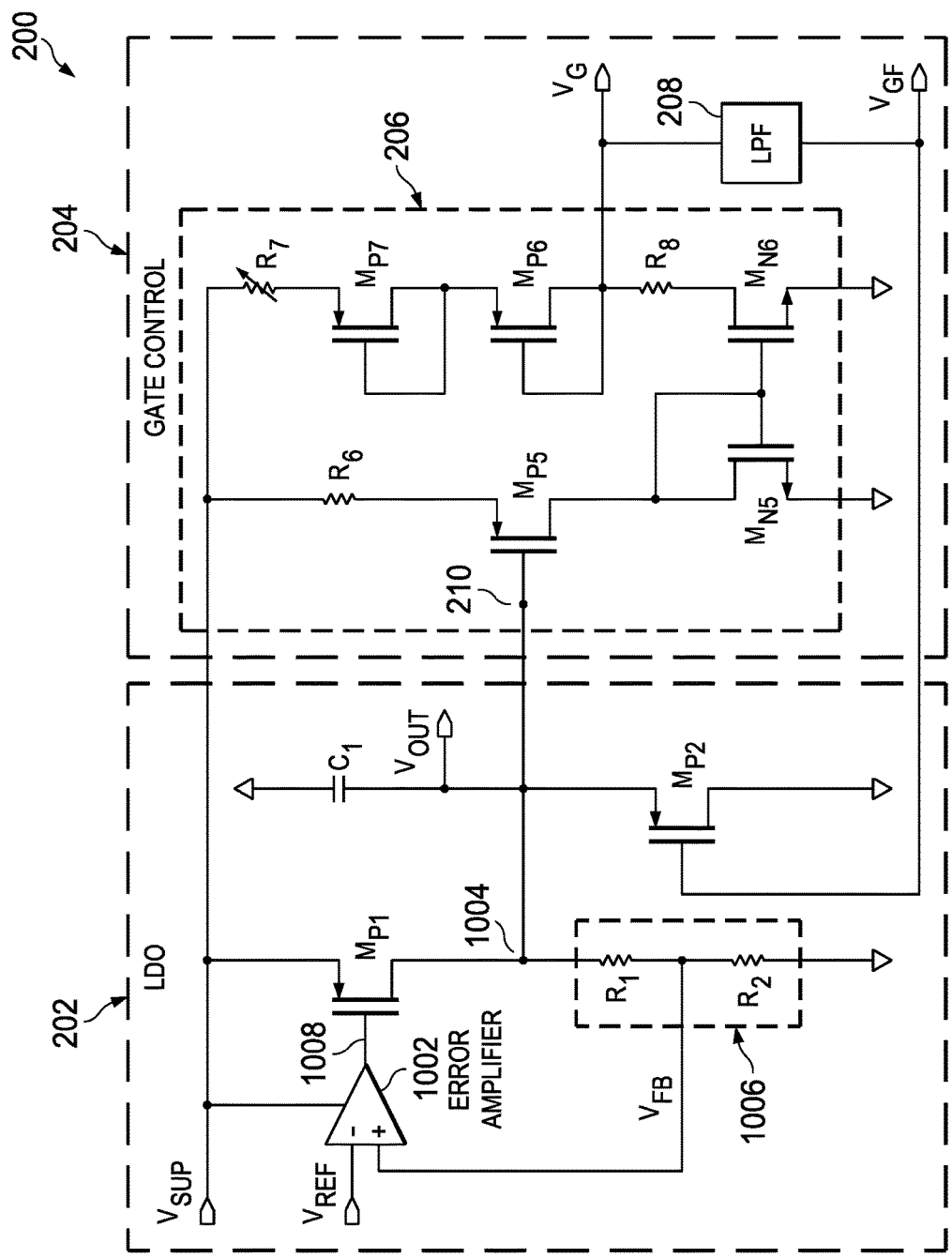
FIG. 2 depicts an example of an LDO according to an embodiment of the disclosure.

The embodiment disclosed in FIG. 1 is designed to handle only transients having a negative slope. However, with appropriate adjustments, the disclosed circuit can be utilized to handle transients having a positive slope. FIG. 2 depicts a schematic diagram of an LDO circuit 200 according to an embodiment of the disclosure. LDO circuit 200 includes LDO 202 and gate control circuit 204. LDO 202 contains all of the elements of prior art LDO voltage regulator 1000 and also includes a PMOS aid transistor $M_{P2}$, which is coupled between the output node and the lower rail and acts to pull down output voltage $V_{OUT}$ during transient increases. The gate of PMOS aid transistor $M_{P2}$ is controlled by gate control circuit 204.

Gate control circuit 204 includes a current mirror circuitry 206 and a low pass filter 208. One leg of the current mirror is formed by NMOS transistor $M_{N5}$, PMOS transistor $M_{P5}$ and resistor $R_6$, which are coupled in series between the lower rail and supply voltage $V_{SUP}$. A second leg of the current mirror is formed by NMOS transistor $M_{N6}$, resistor $R_8$, PMOS transistors $M_{P6}$ and $M_{P7}$, and variable resistor $R_7$, which are coupled in series between the lower rail and the upper rail. NMOS transistor $M_{N5}$ is diode-coupled and the gates of NMOS transistors $M_{N5}$ and $M_{N6}$ have their gate coupled together; both of PMOS transistors $M_{P6}$ and $M_{P7}$ are diode coupled.

Gate control circuit 204 receives the output voltage $V_{OUT}$ at node 210, which in the embodiment shown is the gate of PMOS transistor $M_{P5}$, and converts $V_{OUT}$ into a current using resistor $R_6$. The current through transistor $M_{P5}$ is mirrored using the current mirror 206 and used to provide a gate control voltage $V_G$, also referred to herein as a mirror voltage. Gate control voltage $V_G$ is filtered using low-pass filter 208 to generate filtered gate control voltage $V_{GF}$, which controls the action of PMOS aid transistor $M_{P2}$. The value of gate control voltage $V_G$ and therefore of filtered gate control voltage $V_{GF}$ is set by the two diode-connected transistors, $M_{P6}$, $M_{P7}$, and resistor $R_7$. The ratio between resistors $R_7$ and $R_6$ is selected so that during normal operation, gate control voltage $V_G$ is set slightly below the threshold voltage of PMOS aid transistor $M_{P2}$, thereby placing aid transistor $M_{P2}$ at the verge of conduction. Resistor $R_7$ is a variable resistor whose value can be set by the customer to adjust the sensitivity of aid transistor $M_{P2}$ to transients to fit current requirements.

During a positive slope line transient, supply voltage $V_{SUP}$ increases rapidly. As previously noted, the voltage regulation loop formed by voltage divider 1006 and error amplifier 1002 is slow to respond, so a temporary voltage bump in output voltage $V_{OUT}$ occurs. This voltage bump in turn causes the current through both legs of current mirror 206 to decrease and in turn increases gate control voltage $V_G$. However, the low pass filter 208 filters out this sudden rise in the gate control voltage $V_G$ so that filtered gate control voltage $V_{GF}$ stays relatively stable and rises over a longer time period. This relative stability of filtered gate control voltage $V_{GF}$ as $V_{OUT}$ rises produces a negative gate-to-source voltage on PMOS aid transistor $M_{P2}$ that exceeds the threshold voltage and turns ON PMOS aid transistor $M_{P2}$. PMOS aid transistor $M_{P2}$ is able to pull down output voltage $V_{OUT}$ and reduce the voltage rise at $V_{OUT}$. As the value of filtered gate control voltage $V_{GF}$ slowly rises to the value of gate control voltage $V_G$, PMOS aid transistor $M_{P2}$ will be turned OFF. During the time that aid transistor $M_{P2}$ is turned on, pass transistor $M_{P1}$ is able to resume regulation of required output voltage. It is again noteworthy that if the output voltage $V_{OUT}$ rises over a longer period of time such that the voltage regulation loop is able to adjust, the PMOS aid transistor $M_{P2}$ will not be turned ON.

To ensure that gate control circuit 204 is process and temperature independent, PMOS transistors $M_{P6}$, $M_{P7}$ are each matched to one of PMOS transistor $M_{P5}$ and PMOS aid transistor $M_{P2}$; NMOS transistors $M_{N5}$, $M_{N6}$ are matched to each other; and the resistors $R_6$ and $R_7$ are matched. As in the previous example, the disclosed embodiments detect when the output voltage $V_{OUT}$ is modified and will automatically adjust to ensure proper operation of the aid transistor.

Figure 3:
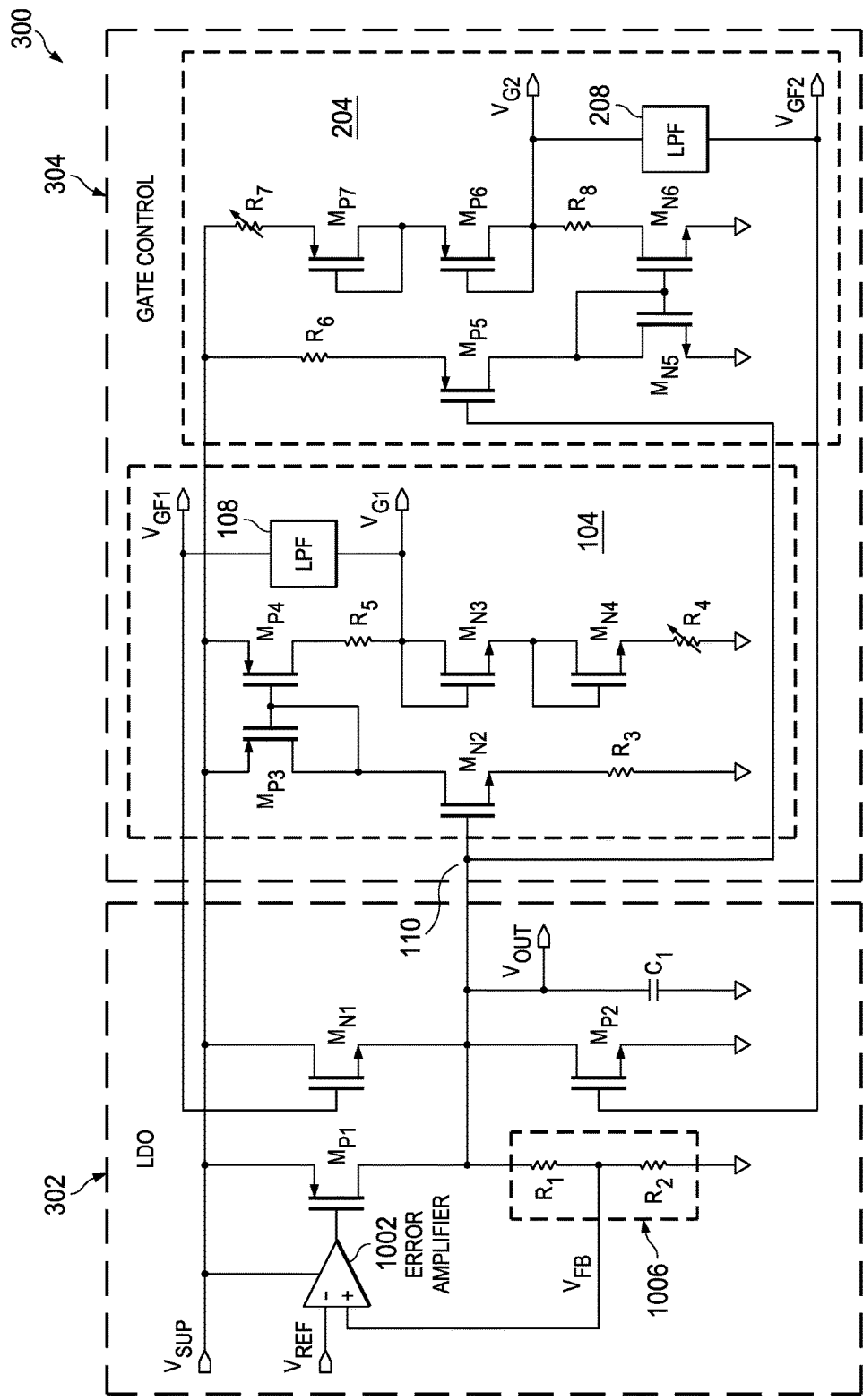
FIG. 3 depicts an example of an LDO that combines the embodiments of FIGS. 1 and 2 according to an embodiment of the disclosure.

As shown in FIG. 3, both an NMOS aid transistor and a PMOS aid transistor having separate gate control circuits can be implemented in a single package. LDO circuit 300 includes LDO 302 and gate control circuit 304. LDO 302 contains both an NMOS aid transistor $M_{N1}$ and a PMOS aid transistor $M_{P2}$. Gate control circuit 304 includes gate control circuit 104 and gate control circuit 204. Gate control circuit 104 receives output voltage $V_{OUT}$ on node 110 and provides both a gate control voltage $V_{G1}$ and a filtered gate control voltage $V_{GF1}$. Filtered gate control voltage $V_{GF1}$ is provided to the gate of NMOS aid transistor $M_{N1}$. Likewise, gate control circuit 204 receives output voltage $V_{OUT}$ from node 110 and provides both a gate control voltage $V_{G2}$ and a filtered gate control voltage $V_{GF2}$. Filtered gate control voltage $V_{GF2}$ is provided to the gate of PMOS aid transistor $M_{P2}$.

Figure 4:
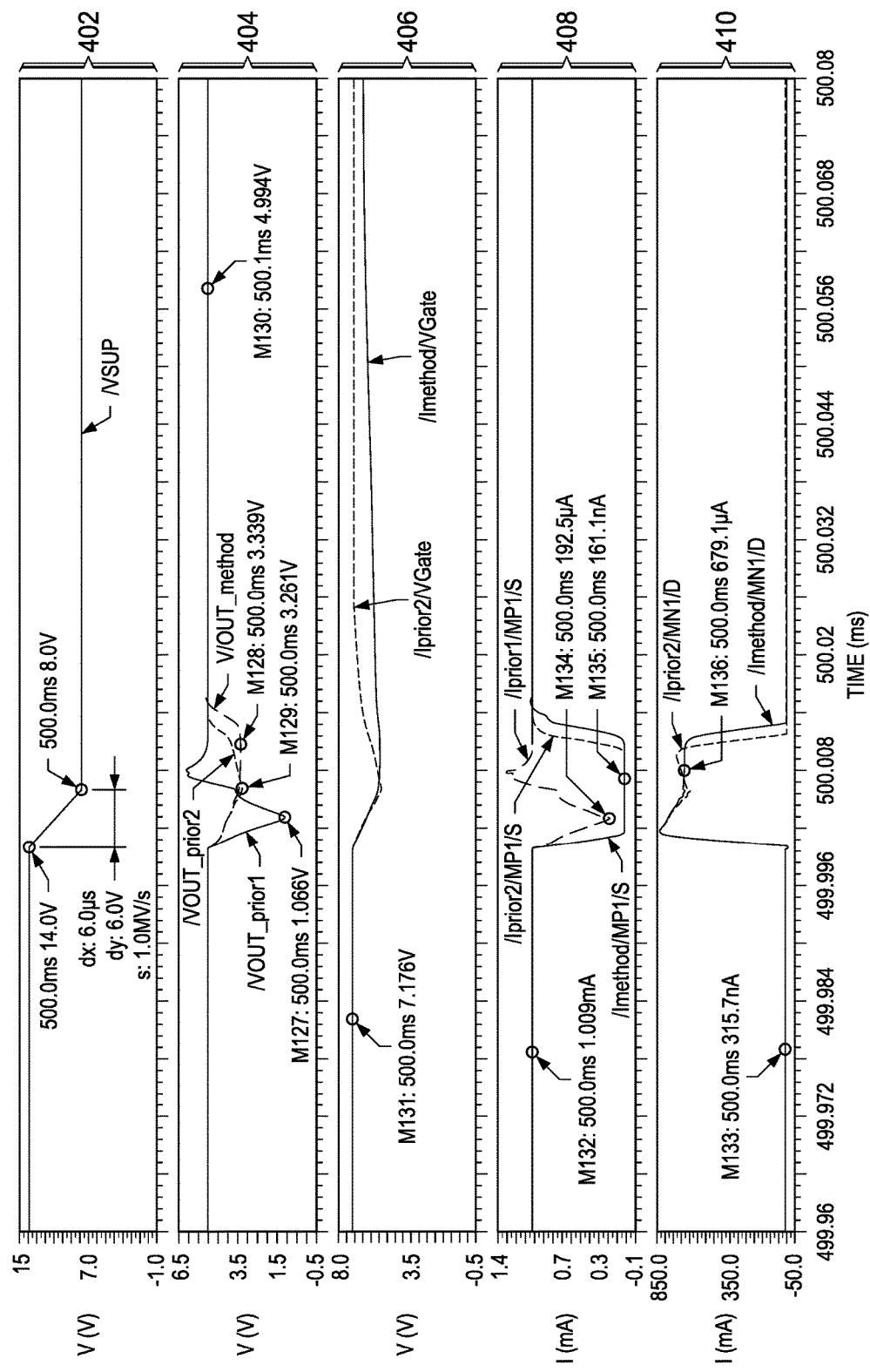
FIG. 4 depicts simulated results for both the prior art and the disclosed embodiments for nominal conditions and a 1 mA load.

FIGS. 4-9 depict a series of simulated tests run on each of the prior art embodiments and the presently disclosed embodiment as shown in FIG. 1. These tests simulate use in an automotive application, in which the car battery that provides the supply voltage can suddenly drop from an exemplary 14 volts as low as 6 volts when certain demands are made on the battery, such as a cold start. FIG. 4 depicts a series of graphs of simulated results for both the prior art and the disclosed embodiments under nominal conditions and a 1 mA load. Section 402 depicts supply voltage $V_{SUP}$, which is initially at 14 V, but suddenly drops to 8 V, a drop of 6 V in 6 μs; voltage supply $V_{SUP}$ then continues at 8 V. Section 404 of the graph depicts $V_{OUT}$ for each of the embodiments of FIG. 10 (prior1), FIG. 11 (prior2) and FIG. 3 (method). Output voltage $V_{OUT}$ in each of the example embodiments is set to provide a voltage of 5 V. In the embodiment of FIG. 10, where no aid transistor is utilized, $V_{OUT}$ drops all the way to 1.066 V before recovering. In the embodiment of FIG. 11, where the aid transistor is controlled by a shunt regulator, output voltage $V_{OUT}$ drops to 3.261 V before recovering. The disclosed embodiment does not drop as far, dropping only to 3.39 V before recovering. Section 406 depicts the gate voltage on the aid transistor for the embodiment of FIG. 11 and the present embodiment. The gate voltage for the embodiment of FIG. 11 rises more quickly, while the present embodiment performs a slow, steady increase. Sections 408 and 410 depict the voltage provided by the pass transistor and the aid transistor respectively. For the two embodiments that have aid transistors, the pass transistor and the aid transistor appear to work harmoniously in these ideal conditions.

Figure 5:
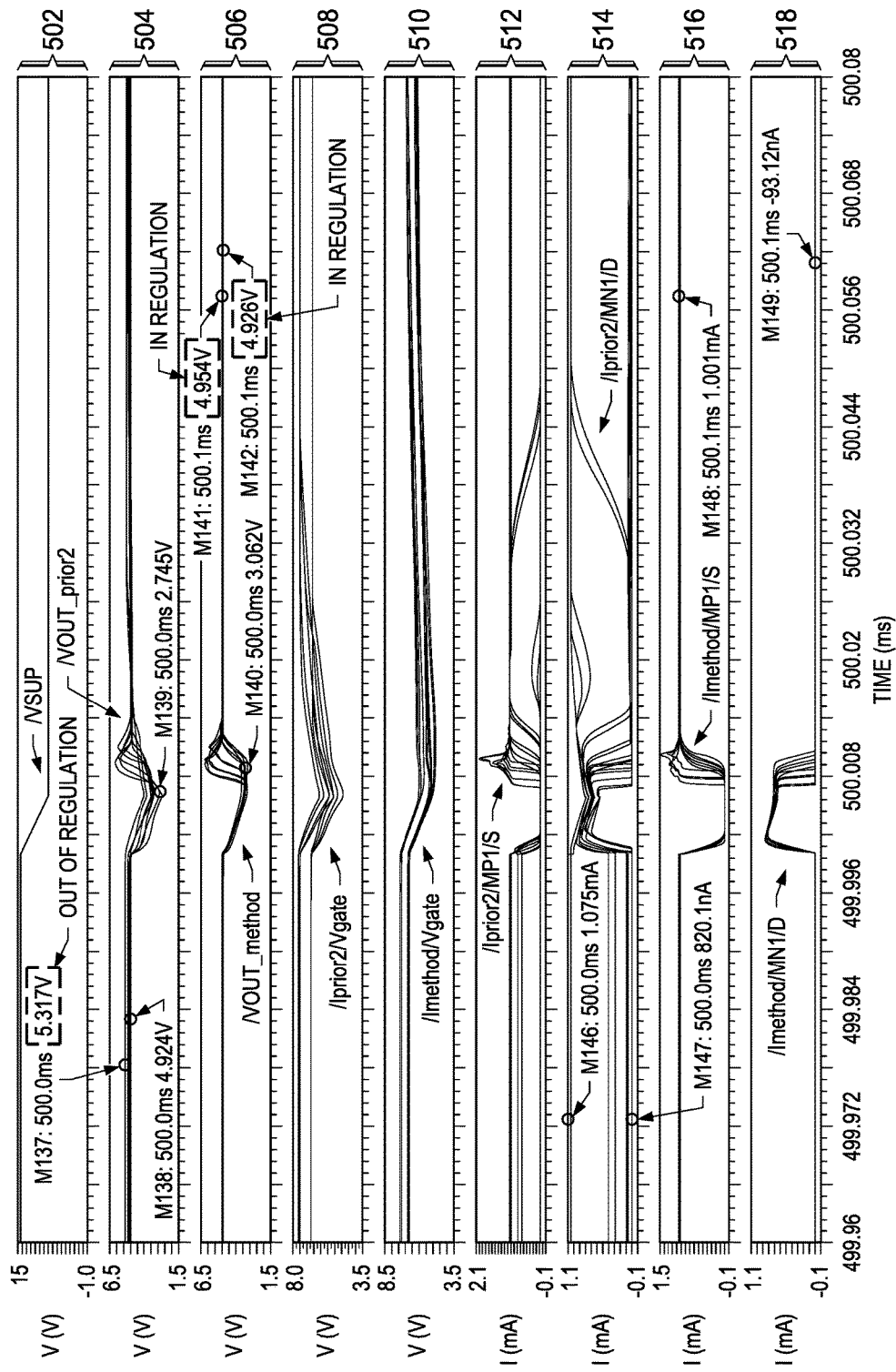
FIG. 5 depicts simulated results for both the prior art and the disclosed embodiments at the corners with a 1 mA load.

FIG. 5 depicts simulated results for both the prior art use of an aid transistor and the disclosed embodiment to compare operation at the process variation and temperature corners with a 1 mA load. In this set of graphs, multiple results are shown for each embodiment, with section 502 depicting supply voltage $V_{SUP}$ during the same type of drop in voltage, section 504 depicting output voltage $V_{OUT}$ for the embodiment of FIG. 11 and section 506 depicting $V_{OUT}$ for the disclosed embodiment. Sections 508, 512 and 514 depict the voltage on the aid transistor gate and currents through the pass transistor and the aid transistor respectively for the embodiment of FIG. 11, while sections 510, 516 and 518 depict the voltage on the aid transistor gate and currents through the pass transistor and the aid transistor respectively for the present embodiment. For the prior art embodiment, it can be observed that output voltage $V_{OUT}$ varied in different conditions, even when no transients were present. For the embodiment of FIG. 11, $V_{OUT}$ reached a high of 5.31 V, which was out of regulation for the required 5 V, while the disclosed embodiments remained in regulation throughout the tests. The cause of the out of regulation readings can be seen by looking at the graphs showing the current from the pass transistor and the aid transistor. In the prior art model, the aid transistor was turned ON in most of the tests, even when no transients were present. The action of the aid transistor in pulling up output voltage $V_{OUT}$ then caused the pass transistor to be turned OFF. In a number of instances, no regulation of the voltage was possible due to the over activity of the aid transistor. In contrast, in the presently disclosed embodiments, the aid transistor remained OFF, except when the aid transistor was necessary to supplement current that the pass transistor was temporarily unable to supply.

Figure 6:
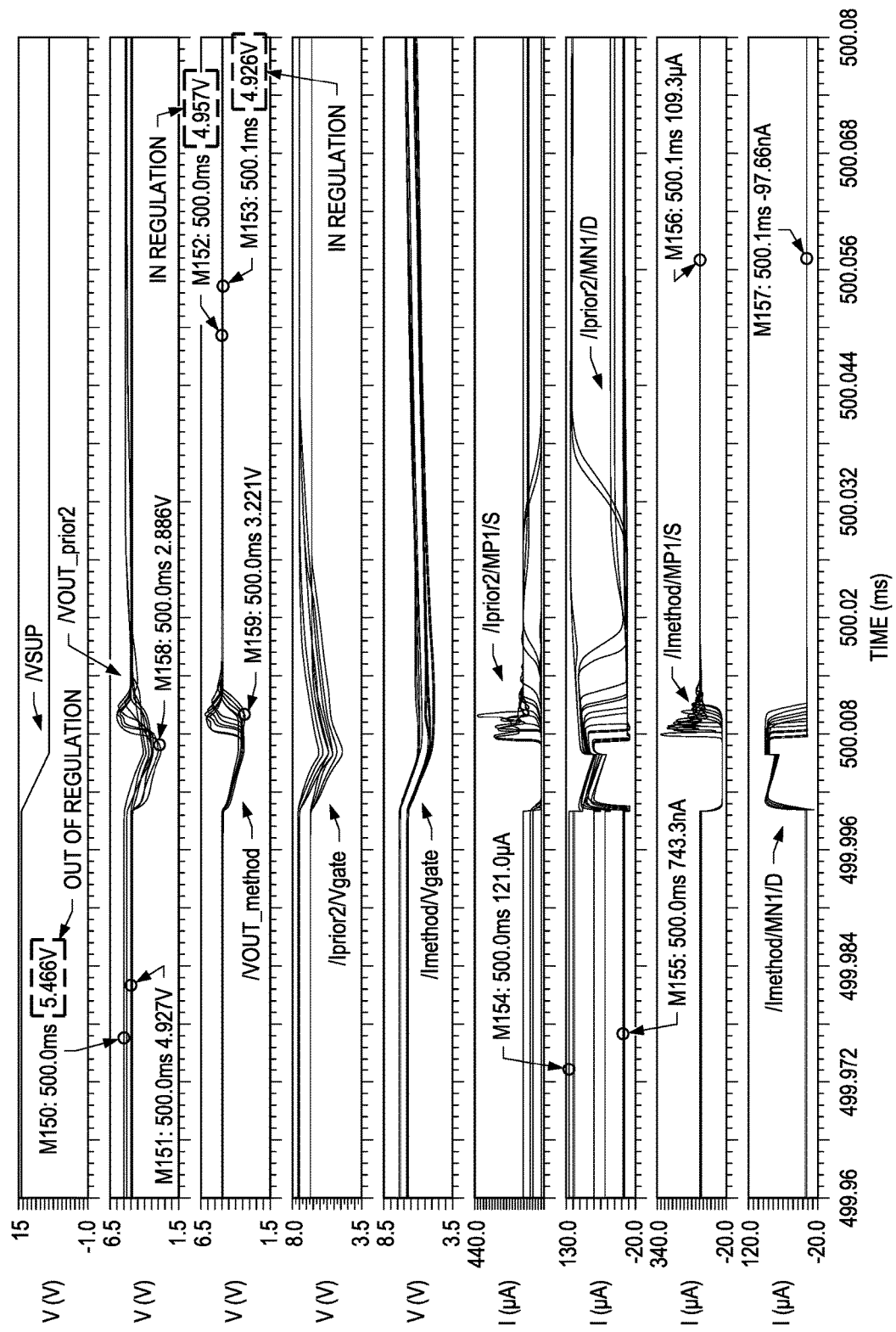
FIG. 6 depicts simulated results for both the prior art and the disclosed embodiments at the corners with a 0.1 mA load.
Figure 7:
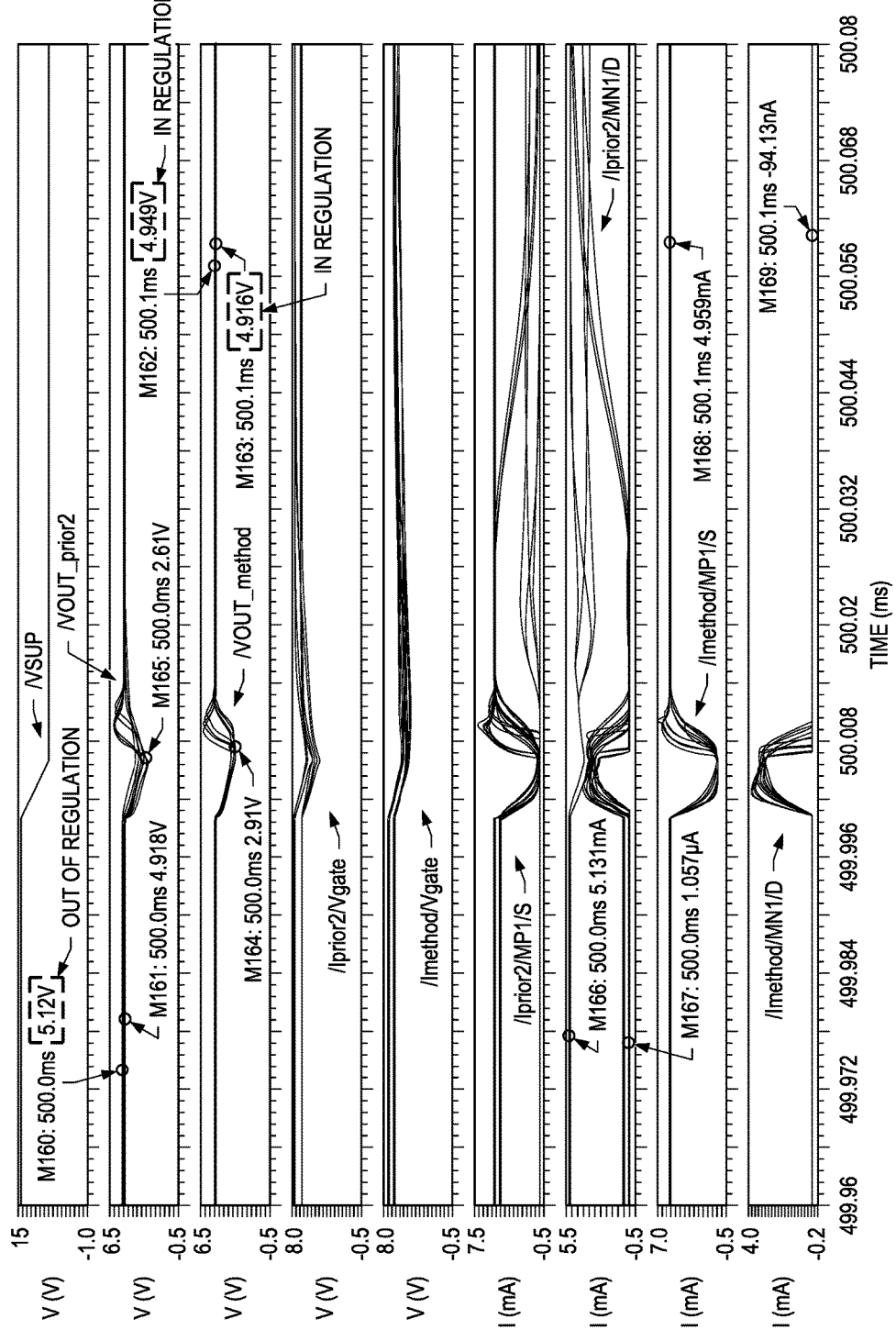
FIG. 7 depicts simulated results for both the prior art and the disclosed embodiments at the corners with a 5 mA load.

The same tests depicted in FIG. 5 were also run to provide the graphs shown in FIGS. 6 and 7. FIG. 6 depicts the simulated results at the process variation and temperature corners with a lowered load of 0.1 mA, while FIG. 7 depicts the simulated results at the process variation and temperature corners with a 5 mA load. In both of these instances, the prior art embodiment demonstrated values of output voltage $V_{OUT}$ that were out of regulation and that resulted from the aid transistor turning ON inappropriately. In each instance, the disclosed embodiment operated correctly and provided the desired 5 V output.

Figure 8:
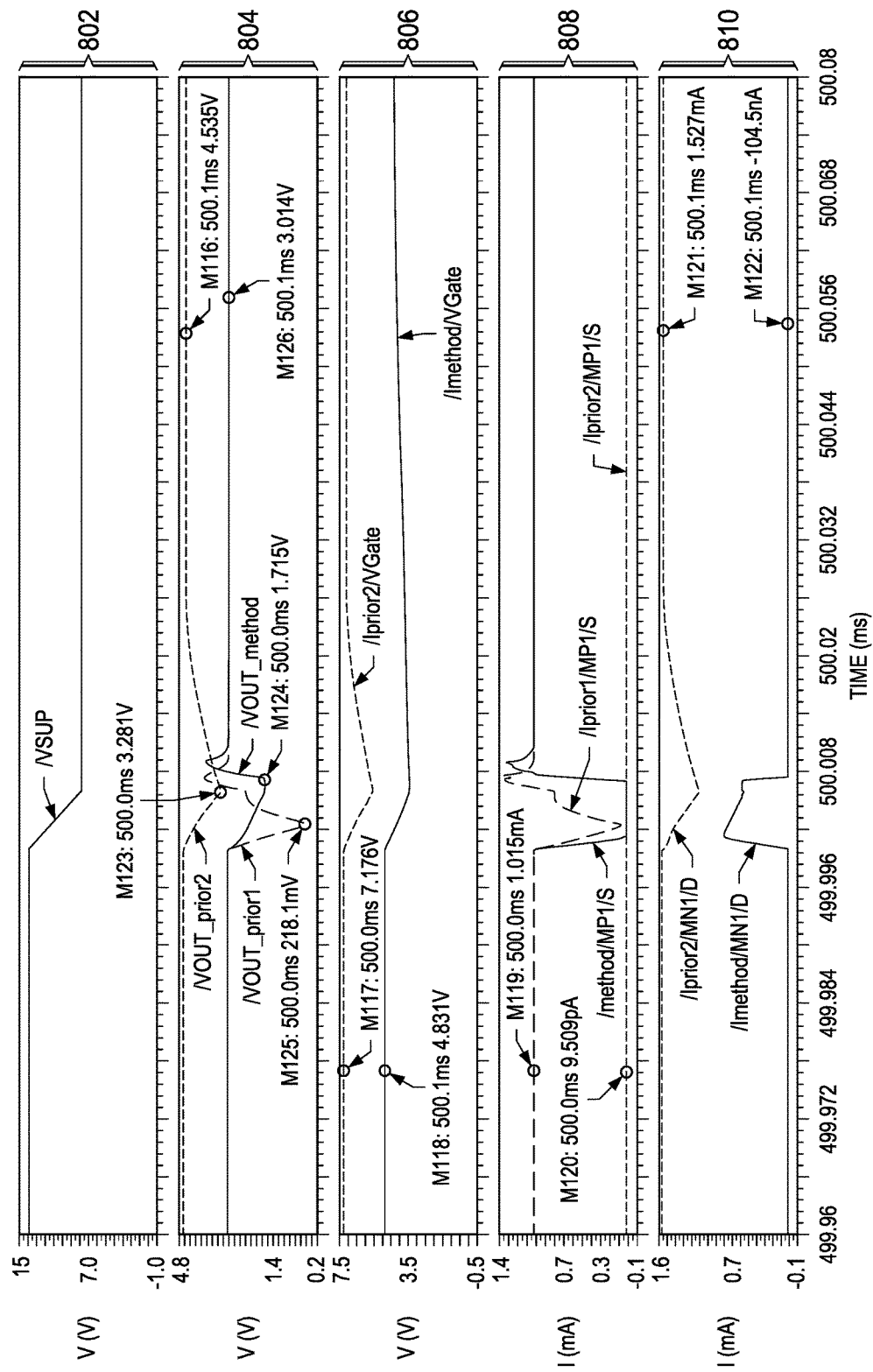
FIG. 8 depicts simulated results for both the prior art and the disclosed embodiments for an adjustable output LDO with a 3 V output.

FIG. 8 depicts the ability of the disclosed embodiment to be utilized with an adjustable output voltage level. The graph of FIG. 8 depicts operation of a circuit that was previously operated with an output voltage of 5 V and is currently being operated with an output voltage of 3 V; both prior art embodiments are shown, as well as the disclosed embodiment. In these simulations, the value of reference voltage $V_{REF}$ has been changed to obtain a 3 V regulator output voltage. Section 802 again depicts the supply voltage $V_{SUP}$, which is initially at 14 volts and drops to 8 volts. Section 804 depicts output voltage $V_{OUT}$ for both prior art embodiments and the disclosed embodiment and section 806 depicts the voltage on the gate of the pass transistor for the two embodiments that have a pass transistor. Section 808 depicts the current provided by the pass transistor for all three embodiments while section 810 depicts the current provided by the aid transistor in the embodiment of FIG. 11 and the disclosed embodiment. The prior art embodiment with no aid transistor (prior1) is able to provide the desired output voltage of 3 V, but goes out of regulation during the voltage drop on supply voltage $V_{SUP}$. In the prior art embodiment that utilizes an aid transistor (prior2), the aid transistor is unable to adjust to the new voltage and turns on during the entire test. Since the aid transistor is ON all of the time, the pass transistor $M_{P1}$ did not turn on during this test and the output voltage was higher than the requested 3 V. However, in the disclosed embodiment, the gate control voltage is set by the output voltage of the LDO, so no further adjustments were necessary to achieve the desired 3 V output voltage and retain the ability to withstand transients.

Figure 9:
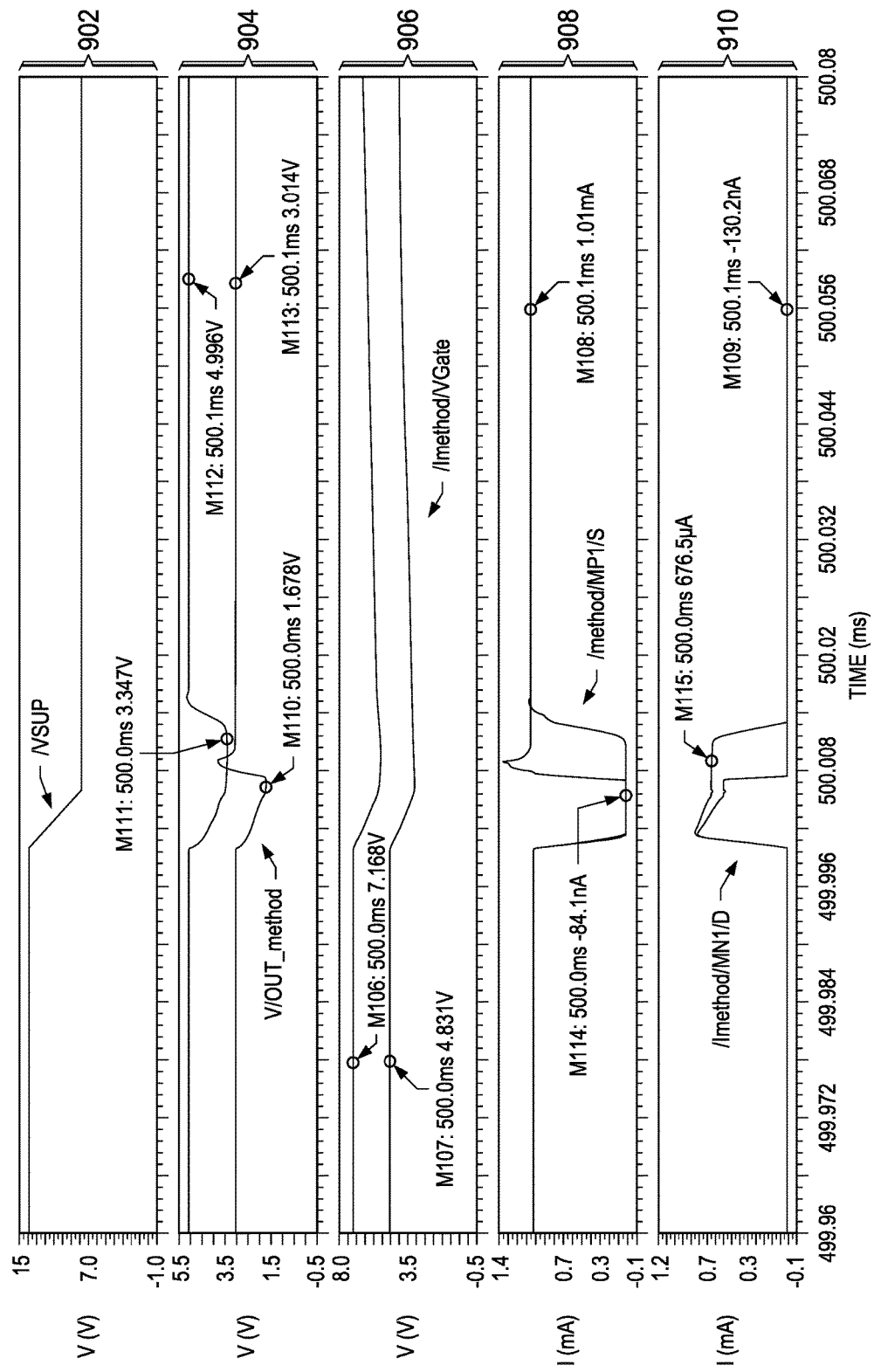
FIG. 9 depicts simulated results for the disclosed embodiments with both 5 V and 3 V outputs.

FIG. 9 depicts simulated results for the disclosed embodiments at both 5 V and 3 V outputs. Section 902 of the graph illustrates the supply voltage, which drops from 14 V to 8 V. Section 904 illustrates output voltage $V_{OUT}$ at both 5 V and 3 V and section 906 illustrates the voltage on the gate of the aid transistor at each of these voltages. Finally, section 908 illustrates the current provided by pass transistor $M_{P1}$ and section 910 illustrates the current provided by NMOS aid transistor $M_{N1}$ at both the desired voltages. In both these tests, the aid transistor remains OFF, except when the pass transistor is temporarily unable to provide the desired output current, demonstrating how the disclosed embodiment is able to operate at multiple voltages. No components in the gate control section need to be adjusted to achieve this result.

Applicant has disclosed a control circuit to handle line transients that is process, voltage and temperature-independent. The control circuit has been disclosed in an embodiment of a linear voltage regulator, but is not limited to use in linear voltage regulators. The disclosed control circuit turns on the aid transistor only during line transients and does not interfere with the main voltage regulation loop. Using the disclosed control circuit and aid transistor(s), recovery after a line transient is inherently faster because the main loop never loses the full regulation control. In low quiescent or low output load current applications, the disclosed circuit ensures proper voltage regulation and minimum current consumption in the aid transistor over process, voltage and temperature conditions.

The disclosed circuit can be utilized for devices with adjustable output voltage levels, since the gate control voltage is set by the output voltage of the LDO. There is no need to re-adjust the components in the gate control block when the output voltage is changed Additionally, because of the architecture, the gate control voltage ($V_{GF}$) is trimmable, which allows programmability of the strength of the aid transistor. The lowest dip voltage can be increased by increasing the size of the aid transistor without interfering with the main loop. The circuit is simple and does not require complicated additional circuitry. Although the disclosed LDO contains a capacitor to stabilize the output voltage, the disclosed circuit is also beneficial for use in cap-less LDOs where an external output capacitor is not present.

While the disclosed embodiments utilize a PMOS pass transistor, it will be understood that the disclosed gate control circuit can also be employed in applications that utilize an NMOS pass transistor.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A circuit comprising:
   (a) a supply rail, a ground rail, and an output node;
   (b) a pass transistor having a source and drain coupled between the supply rail and the output node and having a gate;
   (c) first and second resistors coupled between the output node and the ground rail and forming a voltage divider;
   (d) an error amplifier having a reference voltage input, an input coupled to between the first and second resistors, and an output coupled to the gate of the pass transistor;
   (e) an aid transistor having a source and drain coupled in series between the supply rail and the output node and having a gate; and
   (f) gate control circuitry coupled between the supply rail and the ground rail, the gate control circuitry including:
      (i) current mirror circuitry having a mirror input coupled to the output node and a gate control output; and
      (ii) filter circuitry having a filter input coupled to the gate control output and having a filtered gate control output coupled to the gate of the aid transistor.

2. The circuit of claim 1 in which the pass transistor is a PMOS transistor and the aid transistor is an NMOS transistor.

3. The circuit of claim 1 in which the current mirror circuitry includes:
   a first leg having the mirror input; and
   a second leg that is coupled to the first leg and having the gate control output.

4. The circuit of claim 1 in which the current mirror circuitry includes:
   a first leg having a first, diode-coupled PMOS transistor, a first NMOS transistor, and a third resistor coupled in series between the supply rail and the ground rail, the first NMOS transistor having a gate coupled to the output node; and
   a second leg having a second, diode-coupled PMOS transistor, a fourth resistor, a second, diode-coupled NMOS transistor, a third diode-coupled NMOS transistor, and a variable resistor coupled in series between the supply rail and the ground rail;
   the first and second PMOS transistors having gates that are coupled together; and
   the gate control output is coupled to between the fourth resistor and the second, diode-coupled NMOS transistor.

5. The circuit of claim 4 in which the first and second PMOS transistors are matched to each other.

6. The circuit of claim 4 in which the second NMOS transistor is matched with the aid transistor and the third NMOS transistor is matched with the first NMOS transistor.

7. The circuit of claim 4 in which the third resistor is matched with the variable resistor.

8. The circuit of claim 1 in which the filter circuitry is low pass filter circuitry.

9. The circuit of claim 1 including a first capacitor coupled between the output node and the ground rail.

10. A circuit comprising:
    (a) a supply rail, a ground rail, and an output node;
    (b) a pass transistor having a source and drain coupled between the supply rail and the output node and having a gate;
    (c) first and second resistors coupled between the output node and the ground rail and forming a voltage divider;
    (d) an error amplifier having a reference voltage input, an input coupled to between the first and second resistors, and an output coupled to the gate of the pass transistor;
    (e) an aid transistor having a source and drain coupled in series between the ground rail and the output node and having a gate; and
    (f) gate control circuitry coupled between the supply rail and the ground rail, the gate control circuitry including:
       (i) current mirror circuitry having a mirror input coupled to the output node and a gate control output; and (ii) filter circuitry having a filter input coupled to the gate control output and having a filtered gate control output coupled to the gate of the aid transistor.

11. The circuit of claim 10 in which the pass transistor is a PMOS transistor and the aid transistor is a PMOS transistor.

12. The circuit of claim 10 in which the current mirror circuitry includes:
a first leg having the mirror input; and
a second leg that is coupled to the first leg and having the gate control output.

13. The circuit of claim 10 in which the current mirror circuitry includes:
a first leg having a third resistor, a first PMOS transistor, and a first, diode-coupled NMOS transistor coupled in series between the supply rail and the ground rail, the first PMOS transistor having a gate coupled to the output node; and
a second leg having a variable resistor, a second, diode-coupled PMOS transistor, a third, diode-coupled PMOS transistor, a fourth resistor, and a second diode-coupled NMOS transistor coupled in series between the supply rail and the ground rail;
the first and second NMOS transistors having gates that are coupled together; and
the gate control output is coupled to between the third, diode-coupled PMOS transistor and the fourth resistor.

14. The circuit of claim 13 in which the first and second NMOS transistors are matched to each other.

15. The circuit of claim 13 in which the second PMOS transistor is matched with the aid transistor and the third PMOS transistor is matched with the first PMOS transistor.

16. The circuit of claim 13 in which the third resistor is matched with the variable resistor.

17. The circuit of claim 10 in which the filter circuitry is low pass filter circuitry.

18. The circuit of claim 10 including a first capacitor coupled between the output node and the ground rail.

19. A circuit comprising:
(a) a supply rail, a ground rail, and an output node;
(b) a pass transistor having a source and drain coupled between the supply rail and the output node and having a gate;
(c) first and second resistors coupled between the output node and the ground rail and forming a voltage divider;
(d) an error amplifier having a reference voltage input, an input coupled to between the first and second resistors, and an output coupled to the gate of the pass transistor;
(e) a first aid transistor having a source and drain coupled in series between the supply rail and the output node and having a gate;
(f) first gate control circuitry coupled between the supply rail and the ground rail, the first gate control circuitry including:
(i) first current mirror circuitry having a first mirror input coupled to the output node and a first gate control output; and
(ii) first filter circuitry having a filter input coupled to the first gate control output and having a first filtered gate control output coupled to the gate of the first aid transistor;
(g) a second aid transistor having a source and drain coupled in series between the output node and the ground rail and having a gate;
(f) second gate control circuitry coupled between the supply rail and the ground rail, the second gate control circuitry including:
(i) second current mirror circuitry having a second mirror input coupled to the output node and a second gate control output; and
(ii) second filter circuitry having a filter input coupled to the second gate control output and having a second filtered gate control output coupled to the gate of the second aid transistor.

20. The circuit of claim 19 in which:
the pass transistor is a PMOS transistor;
the first aid transistor is an NMOS transistor;
the second aid transistor is a PMOS transistor;
the first current mirror circuitry includes a first leg having the first mirror input, and a second leg that is coupled to the first leg and having the first gate control output; and
the second current mirror circuitry includes a third leg having the second mirror input, and a fourth leg that is coupled to the third leg and having the second gate control output.

* * * * *